(12) United States Patent
Weber et al.

(10) Patent No.: US 6,177,225 B1
(45) Date of Patent: Jan. 23, 2001

(54) PHOTOSENSITIVE RESIN COMPOSITIONS

(75) Inventors: William D. Weber, Cranston, RI (US); Pamela J. Waterson, Northbridge, MA (US); Steve Lien-Chung Hsu, Tainan (TW); Ahmad Naiini, Warwick, RI (US)

(73) Assignee: Arch Specialty Chemicals, Inc., Norwalk, CT (US)

( * ) Notice: Under 35 U.S.C. 154(b), the term of this patent shall be extended for 0 days.

(21) Appl. No.: 09/404,905

(22) Filed: Sep. 24, 1999

Related U.S. Application Data

(60) Provisional application No. 60/102,694, filed on Oct. 1, 1998.

(51) Int. Cl.$^7$ .................................................. G03F 7/023
(52) U.S. Cl. ........................ 430/190; 430/191; 430/192; 430/193; 430/326; 430/330
(58) Field of Search ................................ 430/190, 192, 430/193, 191, 326, 330

(56) References Cited

U.S. PATENT DOCUMENTS

| | | | |
|---|---|---|---|
| 4,339,521 | 7/1982 | Ahne et al. ........................ | 430/192 |
| 4,371,685 | 2/1983 | Ahne et al. ........................ | 528/73 |
| 4,395,482 | 7/1983 | Ahne et al. ........................ | 430/326 |
| 4,849,051 | 7/1989 | Ahne et al. ........................ | 156/659.1 |
| 5,037,720 | 8/1991 | Khanna ............................ | 430/190 |
| 5,449,584 | 9/1995 | Banba et al. ..................... | 430/190 |

*Primary Examiner*—John S. Chu
(74) *Attorney, Agent, or Firm*—Ohlandt, Greeley, Ruggiero & Perle, L.L.P.

(57) ABSTRACT

A positive photosensitive resin composition. The composition comprising:

(a) a capped polybenzoxazole precursor polymer having the structure;

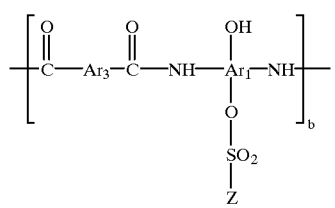

-continued

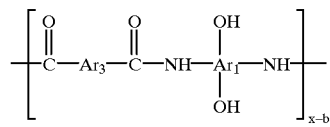

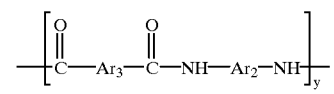

wherein $Ar_1$ is a tetravalent aromatic group, aliphatic group, heterocylic group, or mixtures thereof; $Ar_2$ is a divalent aromatic, heterocyclic, alicyclic, or aliphatic group that optionally may contain silicon; $Ar_3$ is divalent aromatic group, aliphatic group, heterocyclic group, or mixtures thereof;

Z is one of the following groups:

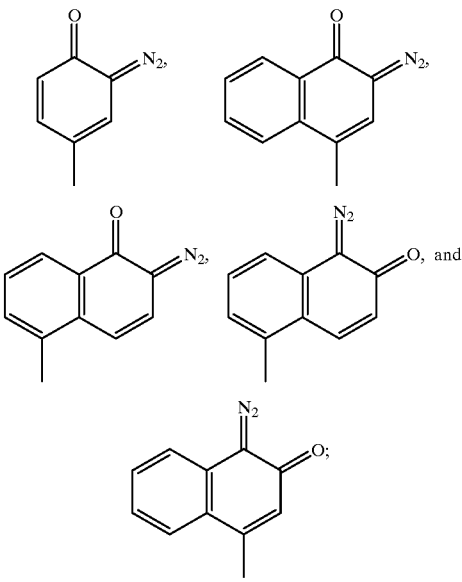

x is 10 to 1000; y is 0 to 900; and b is 0.10 to 350;

(b) a photosensitive agent; and (c) a solvent.

18 Claims, No Drawings

PHOTOSENSITIVE RESIN COMPOSITIONS

This application claims priority from U.S. Provisional application Ser. No. 60/102,694 filed on Oct. 1, 1998.

FIELD OF THE INVENTION

The present invention relates to positive photosensitive resin compositions. More specifically, the present invention relates to positive-working, aqueous base developable photosensitive polybenzoxazole (PBO) precursor compositions that are suitable for applications in the field of microelectronics.

BACKGROUND OF THE INVENTION

In microelectronic applications, polymers that demonstrate high temperature resistance are generally well known. Precursors of such polymers, such as polyimides and polybenzoxazoles can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Conventional positive-working photosensitive polybenzoxazoles (PBO) contain an alkaline soluble PBO precursor and a diazoquinone photoactive compound as shown in U.S. Pat. No. 4,371,685. The diazoquinone compound inhibits the solubility of the PBO precursor in an aqueous base. After exposure to light, the diazoquinone compound undergoes photolysis and converts to indenecarboxylic acid, which promotes the aqueous base solubility of the PBO precursor.

SUMMARY OF THE INVENTION

The present invention provides a positive photosensitive resin composition comprising:

(a) a capped polybenzoxazole precursor polymer having the structure;

wherein $Ar_1$ is a tetravalent aromatic group, aliphatic group, heterocyclic group, or mixtures thereof; $Ar_2$ is a divalent aromatic, heterocyclic, or aliphatic group that may or may not contain silicon; $Ar_3$ is a divalent aromatic group, aliphatic group, heterocylic group, or mixtures thereof; Z is one of the following groups:

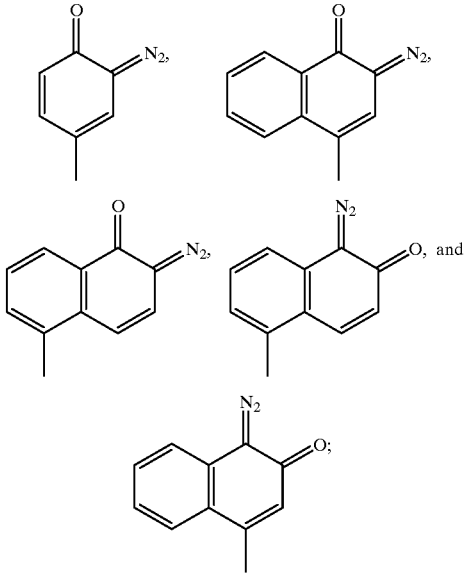

x is 10 to 1000; y is 0 to 900; and b is 0.10 to 350;

(b) a photosensitive agent; and (c) a solvent. The benefits of the positive photosensitive formulations prepared according to the present invention compared to the prior art are: (1) a reduction in the amount of photosensitive agent required in a formulation, to obtain useful dark film dissolution rates; and (2) the optical absorbance of films prepared from the formulations that is due to the diazonapthaquinone moiety in the photosensitive agent is decreased. Consequently, the films prepared according to the present invention have higher optical transparency toward i-line and g-line radiation, resulting in improved photospeed.

(F)

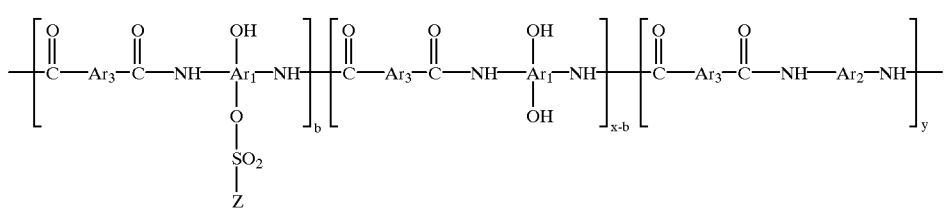

DETAILED DESCRIPTION OF THE INVENTION

One or more capped polybenzoxazole precursor polymers are formed by the reaction of a polybenzoxazole precursor (G) with a diazoquinone compound.

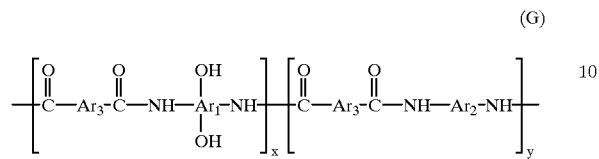
(G)

The polybenzoxazole precursor has a polymerization degree of 10–1000 and is synthesized by the reaction of monomers (A), (B), and (C) in the presence of a base:

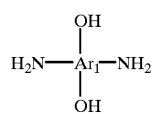
(A)

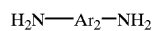
(B)

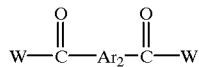
(C)

wherein $Ar_1$, $Ar_2$, $Ar_3$, x, and y are as previously defined, and W is Cl, OR, or H; wherein R is alkyl or cycloalkyl, such as —$CH_3$, —$C_2H_5$, n-$C_3H_7$, i-$C_3H_7$, n-$C_4H_9$, t-$C_4H_9$, cyclohexyl, and the like.

The ratio of [(A)+(B)]/(C) is generally between about 0.9 to 1.1. Monomer (A) is about 10–1000 mole % of [(A)+(B)] and monomer (B) is about 0–90 mole % of [(A)+(B)]. The resulting polymer (G) is then reacted with about 1–35 mole % of a diazoquinone to produce capped polybenzoxazole precursor (F).

wherein $Ar_1$, $Ar_2$, $Ar_3$, Z, x, y, and b are as previously defined.

In monomer (A), which is a constituent (G) and (F), $Ar_1$ is a tetravalent aromatic, aliphatic, or heterocyclic group, and can include, for example, the following moieties:

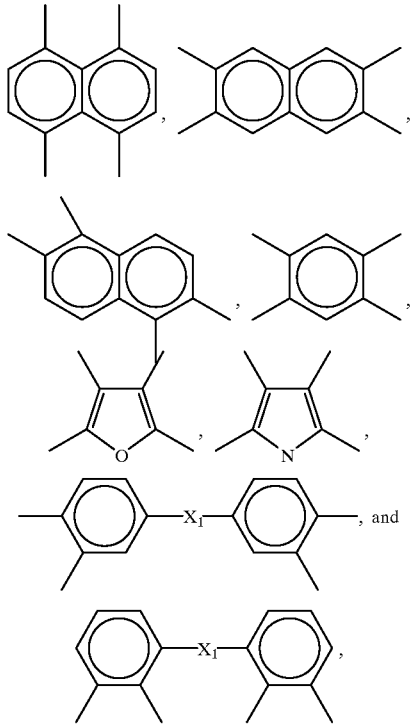

wherein $X_1$ is —O—, —S—, —C(CF$_3$)$_2$—, —CH$_2$—, —SO$_2$—,

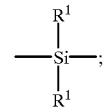

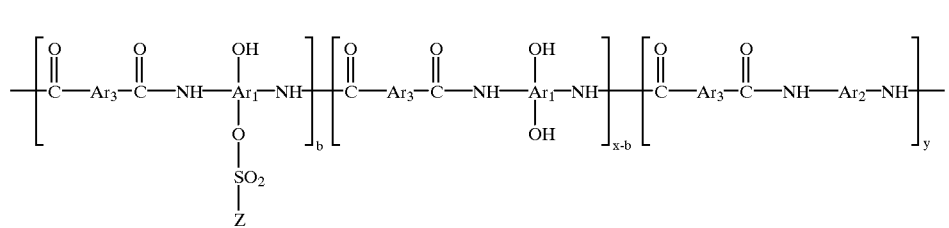
(F)

R¹ alkyl or cycloalkyl, such as —CH₃, —C₂H₅, n-C₃H₇, i-C₃H₇, n-C₄H₉, t-C₄H₉, cyclohexyl, and the like. However, Ar₁ is not restricted to these groups. Furthermore, monomer (A) may be a mixture of two or more monomers.

In monomer (B), which is a constituent of precursor (G) and capped precursor (F), Ar₂ is a divalent aromatic, heterocyclic, alicyclic, or aliphatic group that may or may not contain silicon. The Ar₂ containing monomer (B) includes, for example, 5(6)-diamino-1-(4-aminophenyl)-1, 3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis (4-aminophenoxy) benzene, 1,3-bis(3-amino-phenoxy)benzene, 1,4-bis(γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl) methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methoxyaniline), 4,4'-thio-bis-(2-chloroaniline, 3,3'sulfonyl-dianiline, 3,3'sulfonyl-dianiline, and mixtures thereof. However, it should be understood that monomer (B) is not restricted to these compounds.

In monomer (C), which is a constituent of polybenzoxazole precursor (G) and capped precursor (F), Ar₃ is a divalent aromatic, aliphatic, or heterocyclic group, and includes, for example the following moieties:

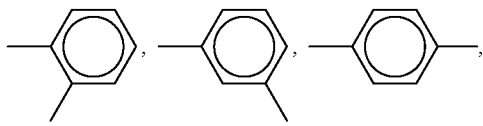

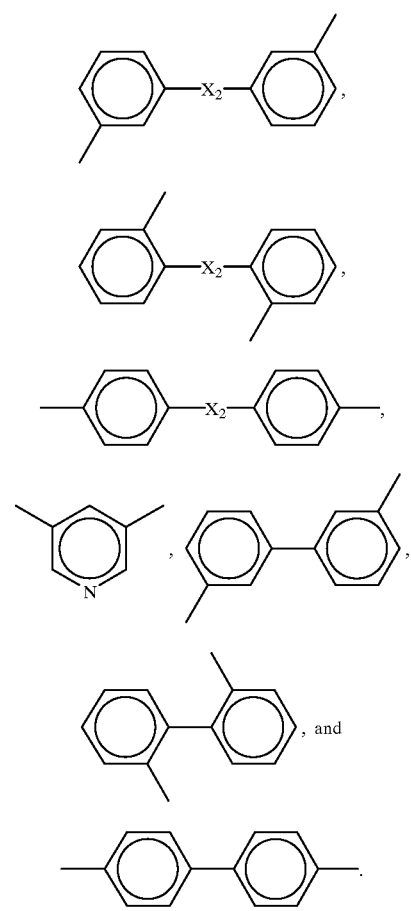

wherein X₂ is —O—, —S—, —C(CF₃)₂—, —CH₂—, —SO₂—, —NHCO—. However, Ar₃ is not restricted to these groups. Furthermore, monomer (C) may be a mixture of two or more monomers.

The diazoquinone compound that is reacted with the PBO precursor (G) can be one of the following:

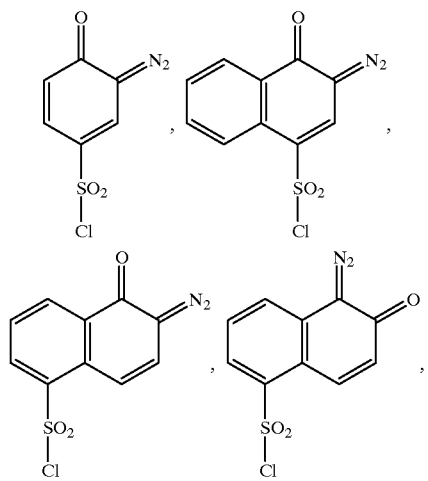

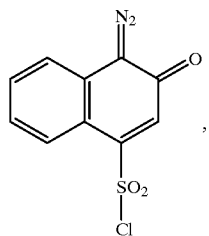

or mixtures thereof.

The preferred reaction solvents are N-methyl-2-pyrrolidone (NMP), γ-butyrolactone (GBL), N,N-dimethylformamide (DMF), N,N-dimethylacetamide (DMAc), dimethyl-2-piperiodone, dimethylsulfoxide (DMSO), sulfolane, and diglyme. The most preferred solvents are N-methyl-2-pyrrolidone (NMP) and γ-butyrolactone (GBL).

Any conventional reaction for reacting dicarboxylic acid or its chloride or ester with at least one aromatic and/or heterocyclic dihydroxydiamine, and optionally, with at least one diamine may be used. Examples of suitable dicarboxylic acids are selected from the group consisting of 4,4'-diphenyletherdicaboxylic acid, terephthalic acid, isophthalic acid and mixtures thereof. Examples of suitable dihydroxydiamine compounds are 3,3'-dihydroxy-4,4'-diaminodiphenylether, 3,3-dihydroxylbenzidine, hexafluoro-2,2-bis-3-amino-4-hydroxyphenylpropane and mixtures thereof. Generally, the reaction is carried out at about –10° C. to about 30° C. for about 6 to 48 hours. The molar ratio of diacid to (diamine+dihydroxydiamine) should be about 0.9–1.1:1.

The capped PBO precursor can be prepared according to the following reaction:

wherein Z is as previously defined.

Any suitable method for reacting a polybenzoxazole with the photoactive moiety Cl—$SO_2$—Z may be used. Generally, the reaction is carried out at about 0° C. to about 30° C. for about 3 to 24 hours in the presence of a base such as pyridine, trialkylamine, methylpyridine, lutidine, n-methylmorpholine, and the like. The most preferred base is triethylamine. The ratio of b/x is from 0.01 to 0.35. The more preferred b/x ratio is from 0.02 to 0.20 and most preferred is from 0.03 to 0.05. The reaction mixture should be protected from actinic rays.

The positive photosensitive resin composition includes one or more capped polybenzoxazole precursors (F) at about 10 wt. % to 50 wt. %, plus a photosensitive agent, and a solvent. Preferably, about 20 wt. % to 45 wt. %, and most preferably, about 30 wt. % to 40 wt. % of the capped polybenzoxazole precursor is added.

The photosensitive agent consists of a diazoquinone compound (H) or dihydropyridine compound (I). Suitable diazoquinone compounds can be, but are not limited to, one of the following structures:

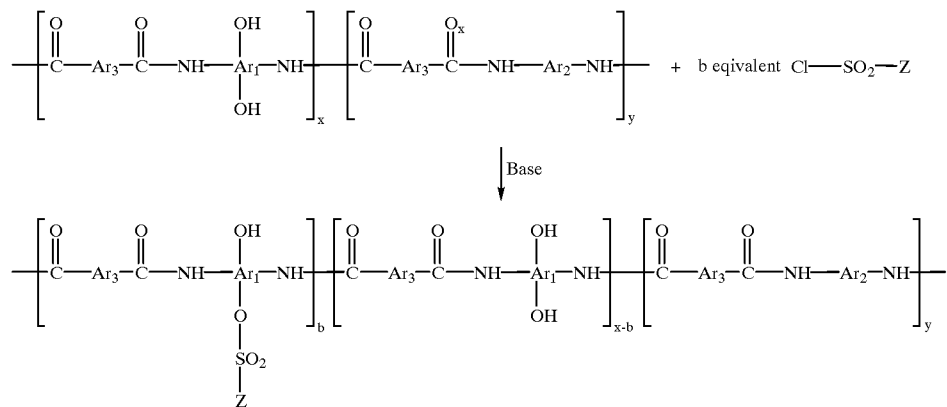

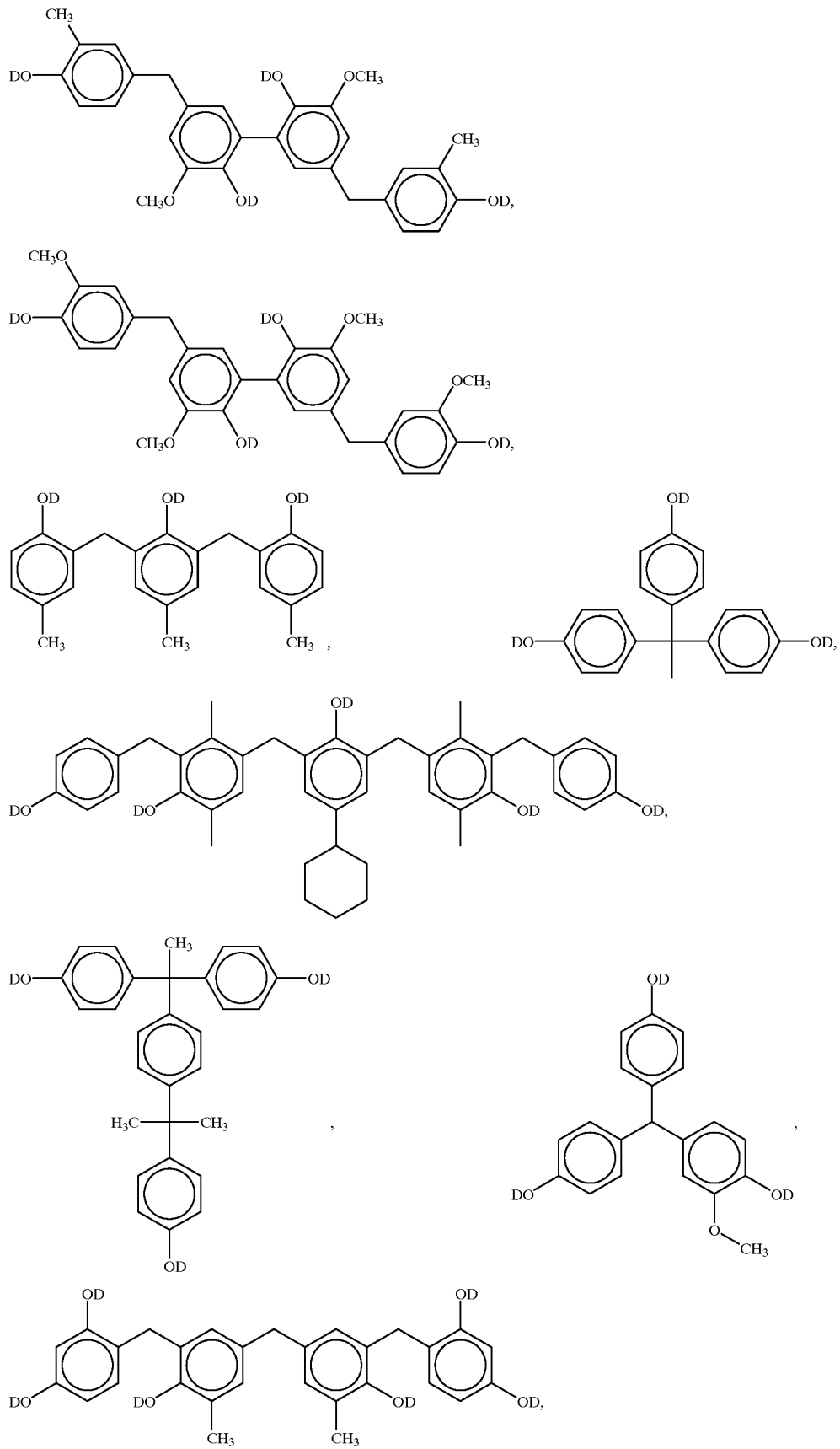

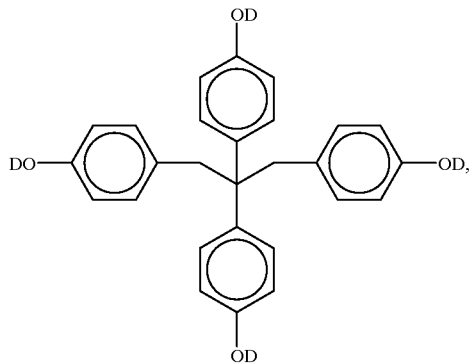
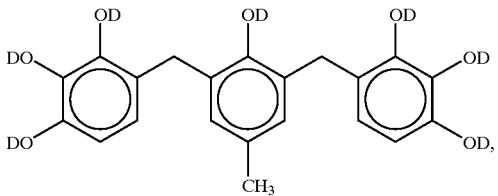
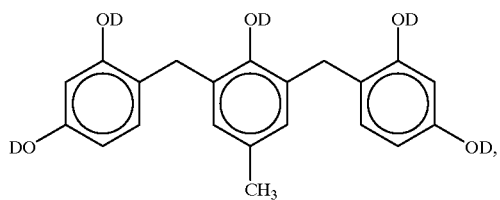
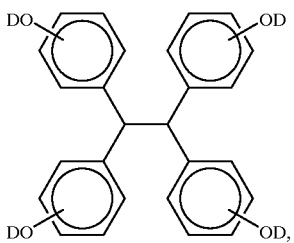
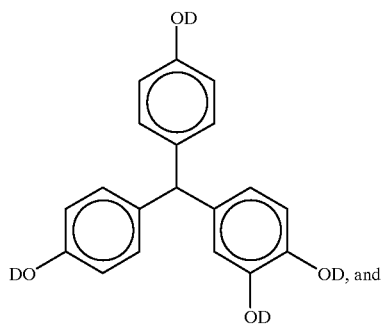
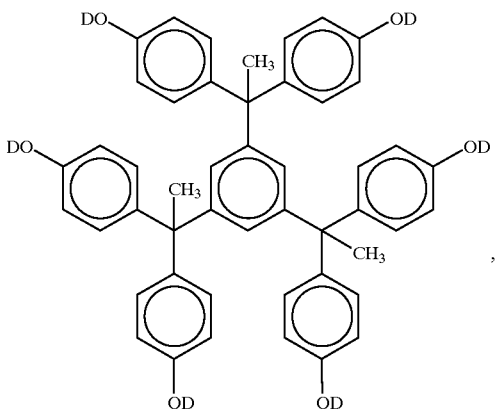
wherein D independently can be H or one of the following moieties:
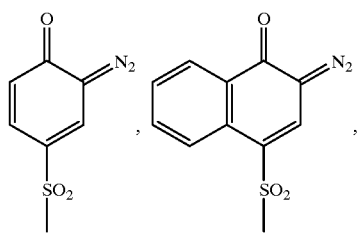
-continued
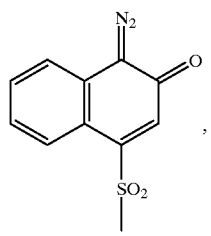
, and
provided, however, in each compound at least one D is not H.
The dihydropyridine (I) can be, for example, a compound with the following structure:

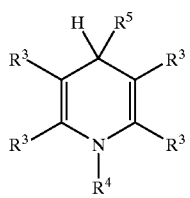

wherein R³ groups are the same or different and have the following structure:

H, OH, COO—(CH₂)ₙ—CH₃, (CH₂)ₙ—CH₃, O—(CH₂)ₙ—CH₃, CO—(CH₂)ₙ—CH₃, (CF₂)ₙ—CF₃, C₆H₅, COOH, (CH₂)n—O—(CH₂)m—CH₃, (CH₂)ₙ—OH, CH₂=CH—(CH₂)ₚ—CO—CH₂, F, Cl, Br or I;

m=0 to 10, n=0 to 10, and p=0 to 4;

R⁴ is H, C₁-C₇ alkyl, cycloalkyl, or phenyl and mono substituted phenyl;

R⁵ is

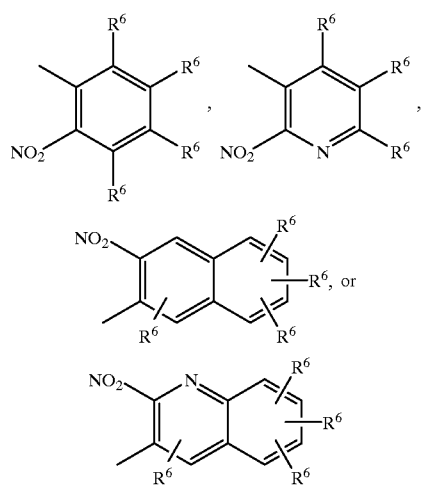

wherein R⁶ is defined the same as R³ and the NO₂ group is in the ortho position in respect to the dihydropyridine ring.

For example, the dihydropyridine may be:

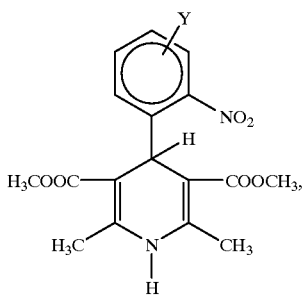

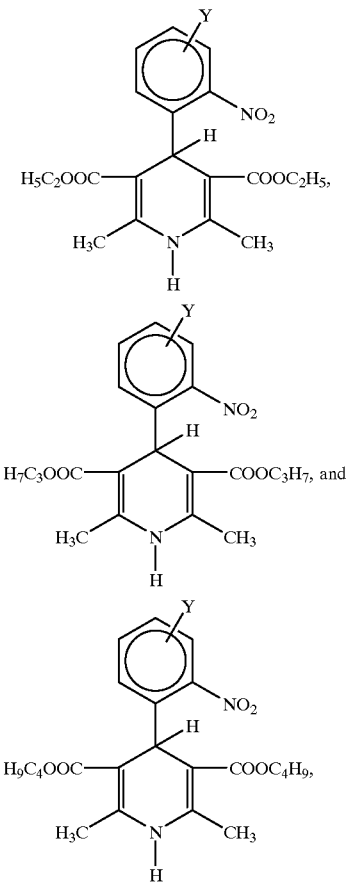

wherein, Y is —OR² where R² is a monovalent substituted or unsubstituted aromatic group or aliphatic group, CN, Cl, Br, or I.

Capped polybenzoxazole precursor (F) can be formulated with one or more diazoquinone compounds (H), one or more dihydropyridines (I), or mixtures thereof. The amount of diazoquinone compound (H) used in this composition is about 1 wt. % to 20 wt. % of the total weight of the composition, preferably, about 2 wt. % to 10 wt. %, and most preferably, about 3 wt. % to 5 wt. %. The amount of dihydropyridine compound (I) used in this composition is about 1 wt. % to 20 wt. % of the total weight of the composition, preferably, about 2 wt. % to 10 wt. %, and most preferably, about 3 wt. % to 5 wt. %. If both the diazoquinone compound (H) and the dihydropyridine compound (I) are used, the amount of (H)+(I) in this composition is about 1 wt. % to 20 wt. % of the total weight of the composition, preferably, about 2 wt. % to 10 wt. %, and most preferably, about 3 wt. % to 5 wt. %.

The positive acting, photoactive resine of this invention is used as a solution dissolved in a solvent. Suitable solvents include, but are not limited to organic solvents, such as N-methylpyrrolidone (NMP), γ-butyrolactone (GBL), N,N-dimethylacetamide (DMAc), dimethyl-2-piperidone, N,N-dimethylformamide (DMF), and mixtures thereof. The preferred solvents are γ-butyrolactone and N-methylpyrrolidone. Most preferred is γ-butyrolactone.

Optionally, an adhesion promoter may be included. Suitable adhesion promotors include, for example, dianhydride/DAPI/bis(3-aminopropyl)tetramethylsiloxane (BATS) polyamic acid copolymers, amino silanes, and mixtures thereof. The inclusion of dianhydride/DAPI/BATS polyamic acid copolymers enhances the adhesion properties of the positive acting photosensitive polybenzoxazole resin composition. The dianhydride/DAPI/BATS polyamic acid copolymers can be synthesized in a reaction solvent by the reaction of a tetracarboxylic dianhydride (J), BATS diamine and DAPI diamine according to the following reaction:

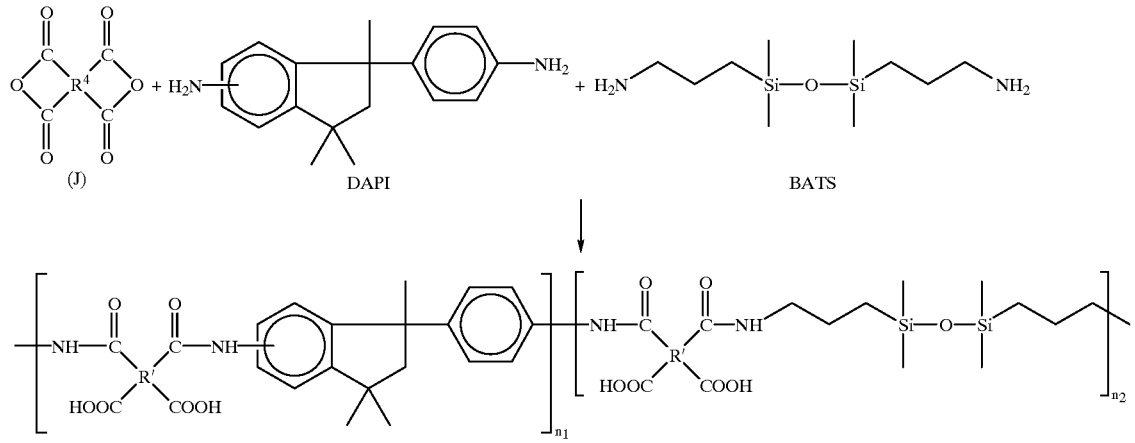

where the R group is a tetravalent radical. The tetracarboxylic dianhydride (J) can be, but is not limited to the following: pyramellitic dianhydride (PMDA), 3,3',4,4'-benzophenoetetracarboxylic dianhydride, 3,3',4,4'-biphenyltetracarboxylic dianhydride, 3,3',4,4'-diphenylsulfonetetracarboxylic dianhydride, 4,4'-perfluorisopropylidinediphthalic dianydride, 4,4'-oxydiphthalic anhydride, bis(3,4-dicarboxyl)tetramethyldisiloxane dianhydride, bis(3,4-dicarboxylphenyl)dimethylsilane dianhydride, butane tetracarboxylic dianhydride, 1,4,5,8-naphthalenetetracarboxylic dianhydride, and mixtures thereof. The molar ratio of DAPI/BATS is about 0.1/99.9 to 99.9/0.1. The preferred molar ratio is about 10/90 to 40/60 and the most preferred molar ratio is about 15/85 to 30/70.

The preferred reaction solvents are N-methyl-2-pyrrolidinone (NMP), γ-butyrolactone (GBL), N,N-dimethylformamide (DMF), N,N-dimethylacetamide (DMAC), dimethylsulfoxide (DMSO), sulfolane and diglyme. The most preferred reaction solvents are N-methyl-2-pyrrolidinone (NMP) and γ-butyrolactone (GBL).

Any suitable reaction for reacting dianhydrides with the two aforementioned diamines may be used. Generally, the reaction is carried out at about 10° C. to about 50° C. for about 6 to 48 hours. The molar ratio of dianhydrides to diamine should be about 0.9–1.1:1.

The photosensitive compositions of the present invention may further include other additives. Suitable additives include, for example, leveling agents and the like.

In addition, the present invention includes a process for forming a relief pattern. The process comprises the steps of: (a) coating on a suitable substrate, a positive-working photosensitive composition comprising one or more capped polybenzoxazole precursors having the structure (F), a photosensitive agent, and solvent, thereby forming a coated substrate; (b) prebaking the coated substrate; (c) exposing the prebaked coated substrate to actinic radiation; (d) developing the exposed coated substrate with an aqueous developer, thereby forming a developed substrate; and (e) curing the developed substrate, thereby forming a cured relief pattern. The process may optionally include the step of post exposure baking the exposed coated substrate at an elevated temperature, prior to developing. Still another optional step is rinsing the developed substrate, prior to curing.

The positive acting, photoactive resin of this invention is coated on a suitable substrate. The substrate may be, for example, semiconductor materials such as a silicon wafer or a ceramic substrate, glass, metal, or plastic. Coating methods include, but are not limited to spray coating, spin coating, offset printing, roller coating, screen printing, extrusion coating, meniscus coating, curtain coating, and immersion coating. The resulting film is prebaked at an elevated temperature of about 70–120° C. for several minutes to half an hour, depending on the method, to evaporate the remaining solvent. Subsequently, the resulting dry film is exposed to acting rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, it is advantageous to heat the exposed coated substrate to a temperature between about 70° C. and 120° C. The exposed coated substrate is heated in this temperature range for a short period of time, typically several seconds to several minutes. This process step is commonly referred to in the art as post exposure baking.

Next, the film is developed by an aqueous developer and a relief pattern is formed. The aqueous developer includes alkali solutions such as inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The most preferred developers are those containing tetramethylammonium hydroxide. In addition, an appropriate amount of a surfactant can be added to the developer. Development can be carried out by means of immersion, spray, puddling, or other similar developing methods.

The relief pattern is then, optionally rinsed using deionized water. The oxazole ring is then formed by curing of the relief pattern to obtain the final pattern of high heat resistant polymer. Curing is performed by baking the developed substrate at the glass transistion temperature $T_g$ of the polymer to obtain the oxazole ring that forms a final pattern of high heat resistance. Typically, temperatures above about

SYNTHESIS EXAMPLE A

To a 100 mL three-necked round bottom flask equipped with a mechanical stirrer, nitrogen inlet and addition funnel, 3.66 g (10 mmol) of hexafluoro-2,2-bis(3-amino-4-hydroxyphenyl)propane, 1.70 g (21 mmol) of pyridine and 15 g of N-methyl-2-pyrrolidone (NMP) were added. The solution was stirred at room temperature until all solids dissolved and then cooled in an ice water bath at 0–5° C. To this solution, 1.01 g (5 mmol) of isophthaloyl chloride and 1.477 g (5 mmol) of 1,4-oxydibenzoyl chloride dissolved in 10 g of NMP was added drop-wise. After the addition was completed, the resulting mixture was stirred at room temperature for 18 hours. The viscous solution was precipitated in 800 mL of vigorously stirred de-ionized water. The polymer was collected by filtration and washed with de-ionized water and a water/methanol (50/50) mixture. The polymer was dried under vacuum at 105° C. for 24 hours. The yield was almost quantitative and the inherent viscosity of the polymer was 0.36 dL/g measured in NMP at the concentration of 0.5 g/dL at 25° C.

SYNTHESIS EXAMPLE B

The reaction in Synthesis Example A was repeated on a 20 fold larger scale, except that a different grade of NMP solvent was used. The work up was done as before and the product was analyzed by GPC, $^1$H NMR, IR and inherent viscosity. The yield was almost quantitative and the inherent viscosity of the polymer was 0.18 dL/g measured in NMP at the concentration of 0.5 g/dL at 25° C.

SYNTHESIS EXAMPLE C

The reaction of Synthesis Example A was repeated except the ratio of dichloride monomers to hexafluoro-2,2-bis(3-amino-4-hydroxyphenyl)propane was adjusted to 0.91. The work up was done as before and the product was analyzed by GPC, $^1$H NMR, IR and inherent viscosity methods. The yield was almost quantitative and the inherent viscosity of the polymer was 0.24 dL/g measured in NMP at the concentration of 0.5 g/dL at 25° C.

SYNTHESIS EXAMPLE D

To a 500 mL three-necked round bottom flask equipped with a mechanical stirrer, nitrogen inlet and addition funnel, 38.46 g (105 mmol) of hexafluoro-2,2-bis(3-amino-4-hydroxyphenyl)propane, 17.83 g (225 mmol) of pyridine and 158 g of N-methyl-2-pyrrolidone (NMP) were added. The solution was stirred at room temperature until all solids dissolved and then cooled in an ice water bath at 0–5° C. To this solution, 14.88 g (73 mmol) of isophthaloyl chloride and 7.21 g (24.4 mmol) of 1,4-oxydibenzoyl chloride dissolved in 80 g of NMP was added drop-wise. After the addition was completed, the resulting mixture was stirred at room temperature for 18 hours. The viscous solution was precipitated in 3 liters of vigorously stirred de-ionized water. The polymer was collected by filtration and washed with de-ionized water and a water/methanol (50/50) mixture. The polymer was dried under vacuum at 105° C. for 24 hours. The yield was almost quantitative and the inherent viscosity of the polymer was 0.28 dL/g measured in NMP at the concentration of 0.5 g/dL at 25° C.

Example 1

To a 100 mL three-necked round bottom flask equipped with a mechanical stirrer, 5.42 g (10.0 mmol) of the polymer obtained in Synthesis Example A and 50 mL of tetrahydrofuran (THF) were added. The mixture was stirred for ten minutes and the solid was fully dissolved. 0.53 g (2 mmole) of 2,1-naphtoquinonediazide-5-sulfonyl chloride was then added and the mixture was stirred for another 10 minutes. Triethylamine, 0.2 g (2 mmol), was added gradually within 15 minutes and then the reaction mixture was stirred for 5 hours. The reaction mixture was then added gradually to 500 mL of vigorously stirred de-ionized water. The precipitated product was separated by filtration and washed with 200 mL of de-ionized water. To the product was added another 600 mL de-ionized water and the mixture vigorously stirred for 30 minutes. After filtration the product was washed with 100 mL de-ionized water. The isolated product was dried at 40° C. overnight. The yield was 91%.

Example 2

The general procedure of Example 1 was repeated with the exception that 0.26 g (1 mmol) of 2,1-naphtoquinonediazide-5-sulfonyl chloride and 0.10 g (1 mmol) of triethylamine were used. The yield of the reaction was 92%.

Example 3

The general procedure of Example 1 was repeated with the exception that 0.79 g (3 mmol) of 2,1-naphtoquinonediazide-5-sulfonic chloride and 0.30 g (3 mmol) of triethylamine were used. The yield of the reaction was 95%.

Example 4

To a 500 mL three-necked round bottom flask equipped with a mechanical stirrer, 40 g (73.8 mmol) of the polymer obtained in Synthesis Example B and 200 mL of tetrahydrofuran (THF) were added. The mixture was stirred for twenty minutes and the solid was fully dissolved. 1.96 g (7.38 mmole) of 2,1-naphtoquinonediazide-5-sulfonyl chloride was then added and the mixture was stirred for another 10 minutes. 0.77 g (7.6 mmol) triethylamine was added gradually within 45 minutes and then the reaction mixture was stirred for 5 hours. The reaction mixture was then added gradually to 2 liters of vigorously stirred de-ionized water. The precipitated product was separated by filtration and washed with 1 liter of de-ionized water. To the product was added another 2 L of de-ionized water and the mixture vigorously stirred for 30 minutes. After filtration the product was washed with 1 L of de-ionized water. The isolated product was dried at 40° C. overnight. The yield of this reaction was 97.1%.

Example 5

To a 500 mL three-necked round bottom flask equipped with a mechanical stirrer, 40 g (73.8 mmol) of the polymer obtained in Synthesis Example C and 200 mL of tetrahydrofuran (THF) were added. The mixture was stirred for twenty minutes and the solid was fully dissolved. 0.2 g (0.738 mmole) of 2,1-naphtoquinonediazide-5-sulfonic chloride was then added and the mixture was stirred for another 10 minutes. 0.077 g (0.76 mmol) triethylamine was added gradually within 45 minutes and then the reaction mixture was stirred for 5 hours. The reaction mixture was then added gradually to 2 liters of vigorously stirred de-ionized water. The precipitated product was separated by filtration and washed with 1 liter of de-ionized water. To the product was added another 2 L of de-ionized water and the mixture vigorously stirred for 30 minutes. After filtration the product was washed with 1 L of de-ionized water. The isolated product was dried at 40° C. overnight. The yield of this reaction was more than 95%.

Example 6

The general procedure of the Example 5 was repeated with the exception that 1.0 g (3.69 mmol) of 2,1-naphtoquinonediazide-5-sulfonic chloride and 0.385 g (3.8 mmol) of triethylamine were used. The yield of the reaction was 96.1%.

SYNTHESIS EXAMPLE E

To a 250 mL three-necked round bottom flask equipped with a mechanical stirrer, nitrogen inlet and addition funnel, 12.00 g (37.26 mmol) of 3,3',4,4'-benzophenonetetracarboxylic dianhydride (BTDA) 1.98 g (7.38 mmol) of 1,2,3-trimethylphenylindane diamine (DAPI), 7.40 g (30.8 mmol) of 1,3-bis(γ-aminopropyl)-1,1,3,3-tetramethylsiloxane (BATS) and 85.5 g of N-methylp-2-pyrrolidinone (NMP) were added. The solution was stirred at room temperature for 20 hours. The inherent viscosity of the resulting polyamic acid was 0.42 dL/g measured in NMP at the concentration of 0.5 g/dL at 25° C.

Example 8

The following positive acting photosensitive compositions was prepared:

| Solvent | Polymer | Adhesion Promoter | PAC |
|---------|---------|-------------------|-----|
| NMP | Synthesis Example A | Polyamic Acid of Synthesis Example E | (structure shown) |
| 8 g | 2 g | 0.2 g | 0.5 g |

Example 7

To a 250 mL three-necked round bottom flask equipped with a mechanical stirrer, 20 g (36.9 mmol) of the polymer obtained in Synthesis Example D and 100 mL of tetrahydrofuran (THF) were added. The mixture was stirred for twenty minutes and the solid was fully dissolved. 1 g (3.69 mmole) of 2,1-naphtoquinonediazide-5-sulfonyl chloride was then added and the mixture was stirred for another 10 minutes. 0.40 g (40.0 mmol) triethylamine was added gradually within 45 minutes and then the reaction mixture was stirred for 5 hours. The reaction mixture was then added gradually to 1 liter of vigorously stirred de-ionized water. The precipitated product was separated by filtration and washed with 0.5 liter of de-ionized water. To the product was added another 1 L of de-ionized water and the mixture vigorously stirred for 30 minutes. After filtration the product was washed with 0.5 L of de-ionized water. The isolated product was dried at 40° C. overnight. The yield of this reaction was more than 95%.

This composition was then spin coated onto a silicon wafer and baked on a hotplate for 3 min at 120° C. to obtain a film of about 8 μm thick. This film was exposed on broad band contact printer at 700 mJ/cm² with a crosshatched grid pattern and then developed to clear using a 0.145 N aqueous tetramethylammonium hydroxide (TMAH) solution followed by a DI water rinse. The coating was then cured for 1 hour at 250° C. in a $N_2$ atmosphere. The wafer was then subjected to a boiling water bath for 72 hours. After drying the wafer, a tape pull test was performed using 3 M Tape 2-622 (170 oz/in²). The results showed 100 out of 100 squares were still attached to the wafer (0% adhesion loss or an ASTM D-3359-83 Method B rating of 5).

Comparative Example 1

The following positive acting photosensitive composition was prepared:

| | | PAC |
|---|---|---|
| Solvent | Polymer | |
| NMP | Synthesis Example A | |
| 8 g | 2 g | 0.5 g |

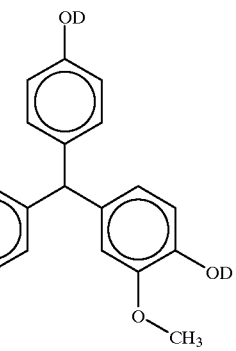

The above comparative formulation was spin coated onto a silicon wafer and baked on a hotplate for 3 min at 120° C. to obtain a film of about 8 μm thick. This film was exposed on broad band contact printer at 700 mJ/cm² with a cross-hatched grid pattern and then developed to clear using a 0.145 N aqueous TMAH solution followed by a DI water rinse. The coating was then cured for 1 hour at 350° C. in an N₂ atmosphere. The wafer was then placed for 72 hours in a boiling water bath. After drying the wafer, a tape pull test was performed using 3 M Tape 2-622 (170 oz/in²). The results showed 21 out of 100 squares were still attached to the wafer (79% adhesion loss or an ASTM D-3359-83 Method B rating of 0)

Example 9

A positive-active photosensitive formulation of the following composition was prepared:

| | | PAC |
|---|---|---|
| Solvent | Polymer | |
| GBL | PBO Precursor of Example 4 | |
| 16.25 g | 8.75 g | 1.07 g |

This was then spin coated onto a silicon wafer and baked on a hotplate for 3 min at 120° C. to obtain a film of about 7.5 μm thick. This film was exposed on an i-line stepper and then developed using a 0.262 N aqueous TMAH solution by a DI water rinse. A resolution of 5 μm was obtained at 400 mJ/cm² with a film retention of 86%.

Comparative Example 2

A positive-acting photosensitive formulation of the following composition was prepared:

| | | PAC |
|---|---|---|
| Solvent | Polymer | |
| GBL | PBO precursor of Synthesis Example C | |
| 14 g | 6 g | 1.5 g |

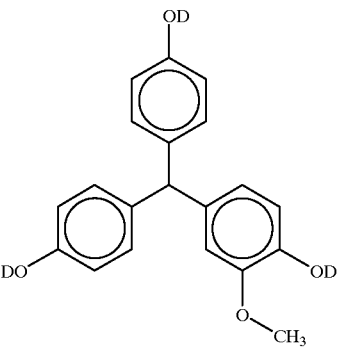

the formulation was spin coated onto a silicon wafer and baked on a hotplate for 3 min at 120° C. to obtain a film of about 7.5 μm thick. This film was exposed on an i-line stepper and then developed using a 0.262 N aqueous TMAH solution followed by a DI water rinse. A resolution of 5 μm was obtained at 540 mJ/cm² with a film retention of 86%.

Example 10

A positive-acting photosensitive formulation of the following composition was prepared:

| Solvent | Polymer | PAC |
|---------|---------|-----|
| GBL | PBO precursor of Example 5 | (structure: tetra-substituted methane core with two p-hydroxyphenyl (OD) groups and CH₃ on one carbon, and a p-phenylene linked to C(CH₃)₂ bearing a p-hydroxyphenyl (OD) group; one DO on another ring) |
| 18.7 g | 6 g | 1.3 g |

This formulation was spin-coated onto a silicon wafer and baked on a hotplate for 3 min at 120° C. to obtain a film of about 9 μm thick. This film was exposed on an i-line stepper and then developed using a 0.262 N aqueous TMAH solution followed by a DI water rinse. A resolution of 5 μm was obtained at 660 mJ/cm² with a film retention of 83%.

Example 11

A positive-acting photosensitive formulation of the following composition was prepared:

| Solvent | Polymer | PAC |
|---------|---------|-----|
| GBL | PBO Precursor of Example 7 | (triarylmethane structure with OD, DO, OD substituents and an OCH₃ group) |
| 17.5 g | 7.5 g | 0.92 g |

The formulation was spin coated onto a silicon wafer and baked on a hotplate for 3 min at 120° C. to obtain a film of about 9.5 μm thick. This film was exposed on broad band contact printer at 800 mJ/cm² with a multidensity pattern that allows different percentages of the dose to pass through the mask and then developed using a 0.262 N aqueous TMAH solution followed by a DI water rinse. A resolution of 5 μm was obtained at 400 mJ/cm2 (50% transmission) with a film retention of 85%.

Example 12

A positive-acting photosensitive formulation of the following composition was prepared:

| Solvent | Polymer 1 | Polymer 2 | Adhesion | PAC 1 | PAC 2 |
|---|---|---|---|---|---|
| GBL | PBO Precursor of Example 5 | PBO Precursor of Example 6 | Promoter Amino-silane | 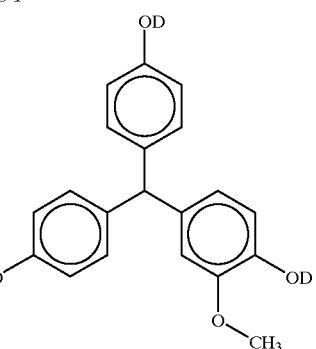 | 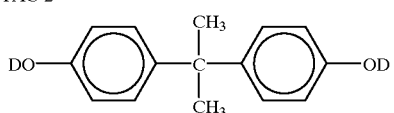 |
| 21 g | 4.5 g | 4.5 g | 42 mg | 0.38 g | 1 g |

This was then spin coated onto a silicon wafer and baked on a hotplate for 3 min at 120° C. to obtain a film of about 7 μm thick. This film was exposed on an i-line stepper and then developed using a 0.262 N aqueous TMAH solution followed by a DI water rinse. A resolution of 5 μm was obtained at 300 mJ/cm² with a film retention of 70%.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A positive photosensitive resin composition comprising:

(a) a capped polybenzoxazole precursor polymer having the structure;

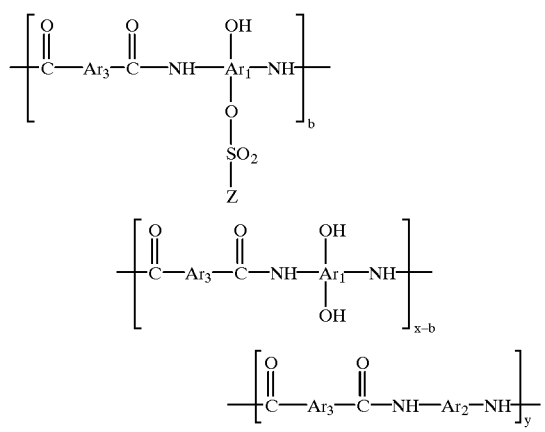

wherein $Ar_1$ is a tetravalent aromatic group, aliphatic group, heterocyclic group, or mixtures thereof; $Ar_2$ is a divalent aromatic, heterocyclic, alicyclic, or aliphatic group that optionally may contain silicon; $Ar_3$ divalent aromatic group, aliphatic group, heterocyclic group, or mixtures thereof;

Z is one of the following groups;

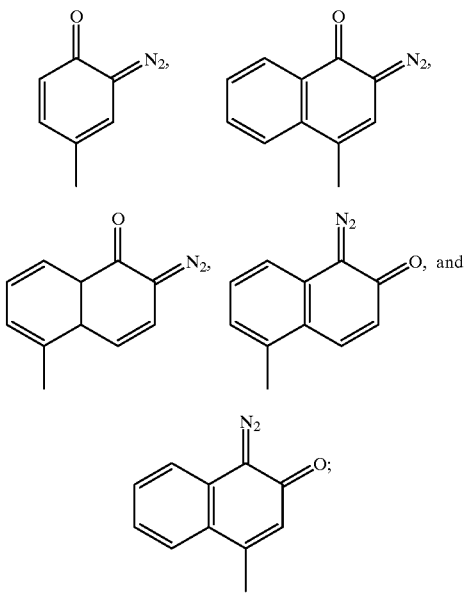

x is 10 to 1000; y is 0 to 900; and b is 0.10 to 350;

(b) a photosensitive agent; and (c) a solvent.

2. The composition of claim 1, wherein said capped polybenzoxazole precursor is about 10 wt. % to 50 wt. % of the total weight of said composition.

3. The composition of claim 1, wherein $Ar_1$ is hexafluoro propane-2,2-(biphenyl) radical and $Ar_3$ is a radical selected from the group consisting of a phthaloyl, or a 1,4-oxydibenzoyl, and mixtures thereof.

4. The composition of claim 1, wherein said photosensitive agent is about 1 wt. % to 20 wt. % of the total weight of said composition.

5. The composition of claim 1, wherein said photosensitive agent is a diazoquinone compound with a structure selected from the group consisting of:

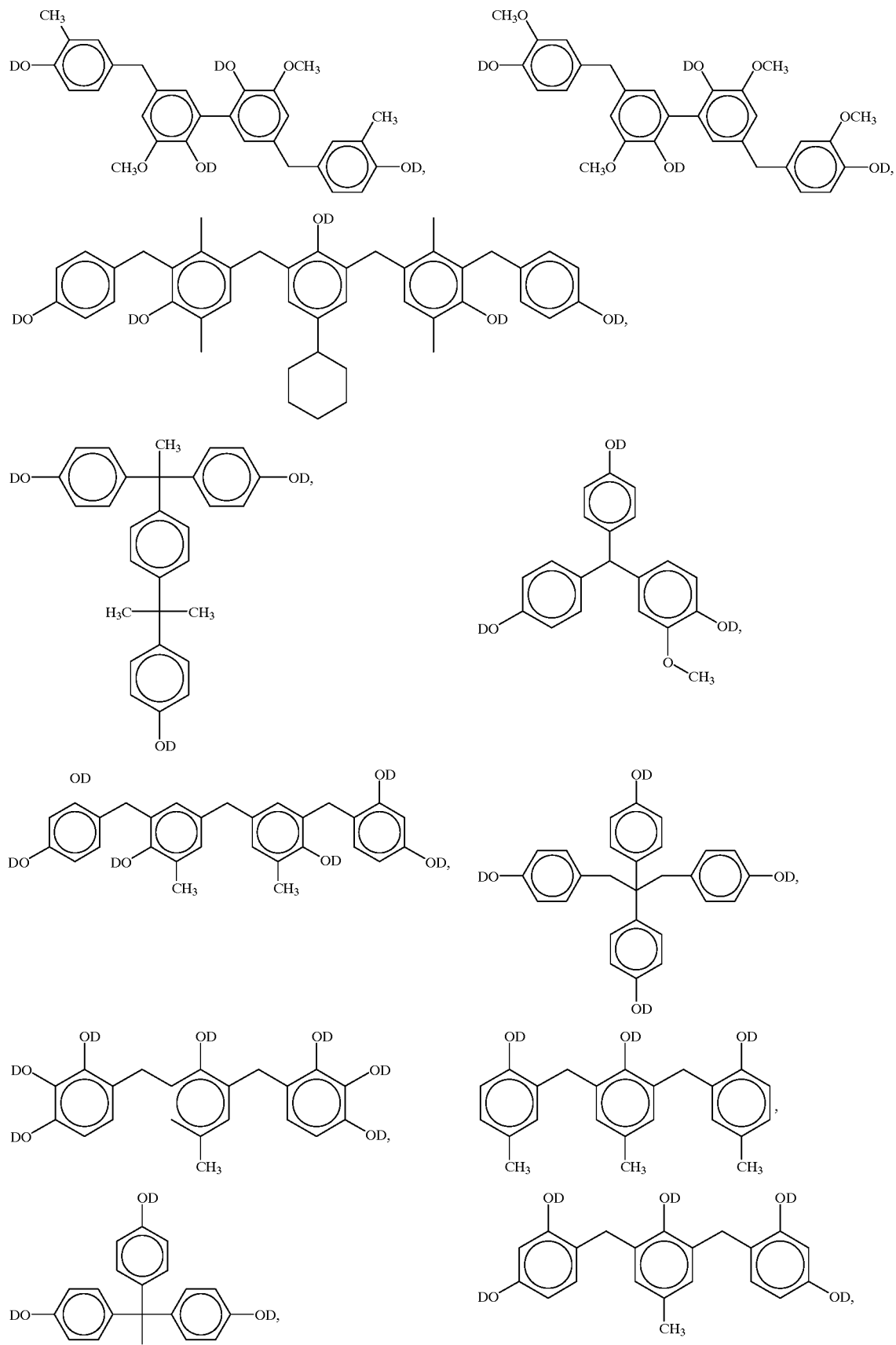

29

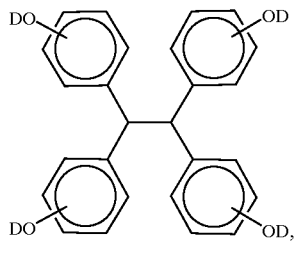

-continued

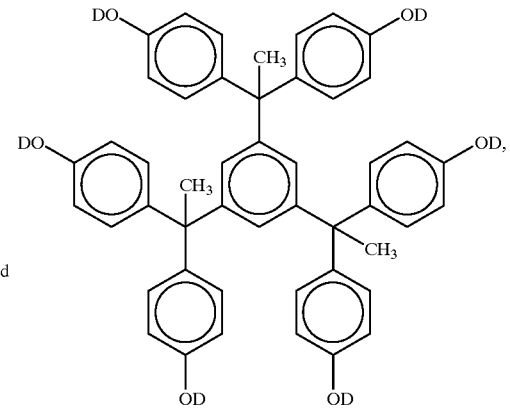

wherein D independently can be H or one of the following moieties:

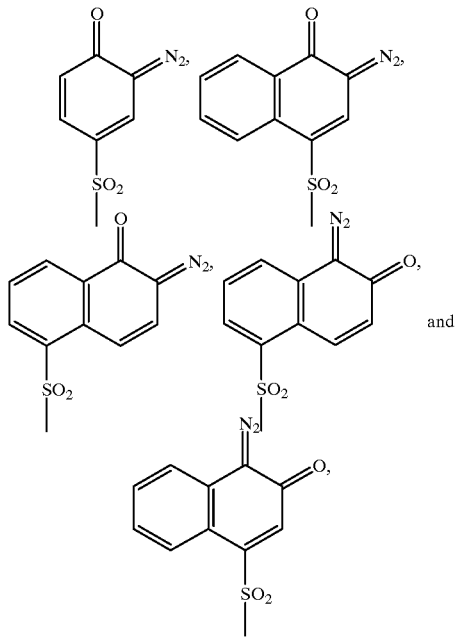

provided, however, in each compound at least one D is not H.

6. The composition of claim 1, wherein said photosensitive agent is a dihydropyridine compound having the structure:

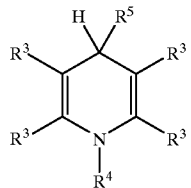

wherein $R^3$ groups are the same or different and have the following structure: H, OH, COO—$(CH_2)_n$—$CH_3$, $(CH_2)_n$—$CH_3$, O—$(CH_2)_n$—$CH_3$, CO—$(CH_2)_n$—$CH_3$, $(CF_2)_n$—$CF_3$, $C_6H_5$, COOH, $(CH_2)n$—O—$(CH_2)m$—$CH_3$, $(CH_2)_n$—OH, $(CH=CH)_p$—CO—$CH_3$, F, Cl, Br or I;

m=0 to 10, n=0 to 10, and p=1 to 4;

$R^4$ is H, $C_1$-$C_7$ alkyl, cycloalkyl, or phenyl and mono substituted phenyl;

$R^5$ is

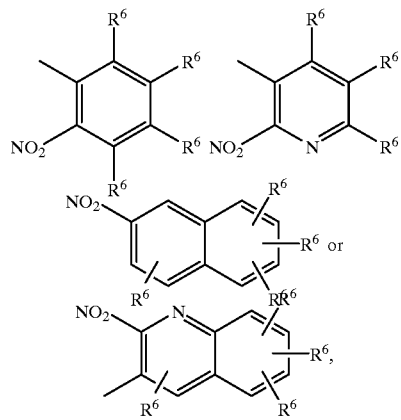

wherein $R^6$ is defined the same as $R^3$ and the $NO_2$ group is the ortho position in respect to the dihydropyridine ring.

7. The composition of claim 6, wherein said photosensitive agent is a dihydropridine compound with a structure selected from the group consisting of:

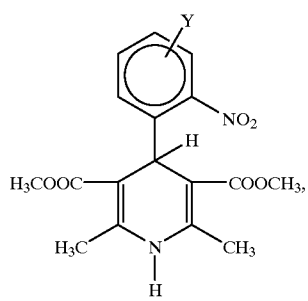

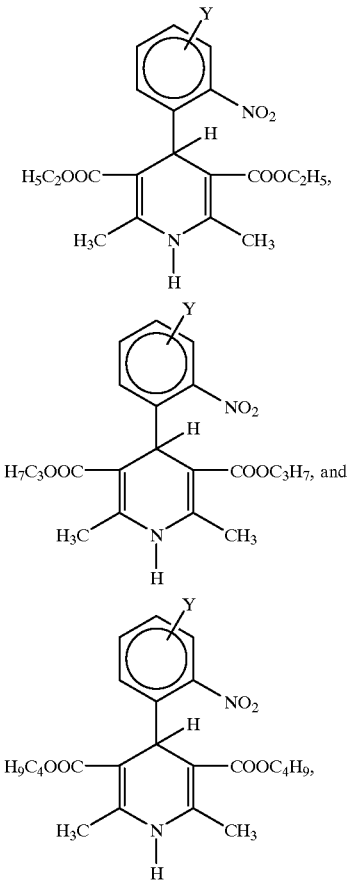

wherein, Y is —OR² where R² is a monovalent substituted or unsubstituted aromatic or aliphatic group, CN, Cl, Br, or I.

8. The composition of claim 1, wherein said solvent is selected from the group consisting of N-methylpyrrolidone, γ-butyrolactone, N,N-dimethylacetamide, dimethyl-2-piperidone, N,N-dimethylformamide, and mixtures thereof.

9. The composition of claim 8, wherein said solvent is γ-butyrolactone.

10. The composition of claim 1, further comprising an adhesion promoter.

11. The composition of claim 10, wherein said adhesion promotor is a copolymer with the following structure:

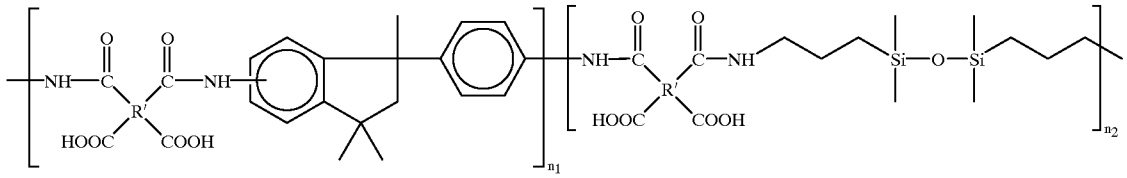

wherein R is a tetravalent radical.

12. The composition of claim 1, further comprising one or more additives selected from the group consisting of adhesion promoters, leveling agents, and mixtures thereof.

13. A process for forming a relief pattern, comprising the steps of:
a) coating on a substrate, a positive photosensitive resin composition comprising one or more capped polybenzoxazole precursors having the structure:

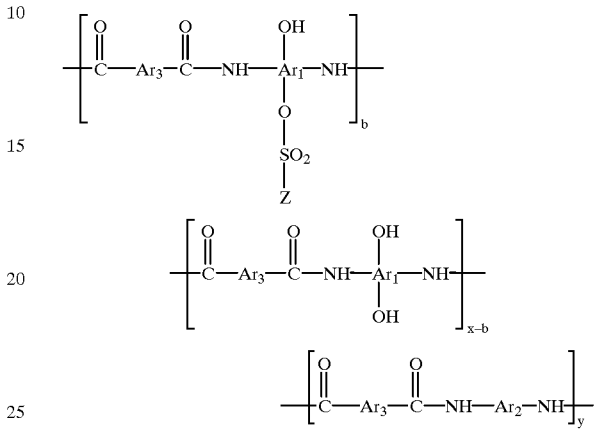

wherein $Ar_1$ is a tetravalent aromatic group, heterocyclic group, or mixtures thereof; $Ar_2$ is a divalent aromatic, heterocyclic, alicyclic, or aliphatic group that optionally may contain silicon; $Ar_3$ is a divalent aromatic group, heterocyclic group, or mixtures thereof;
A is one of the following groups;

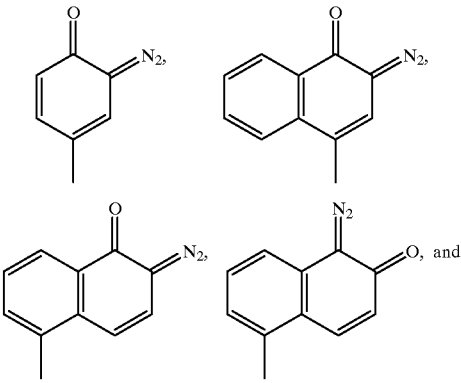

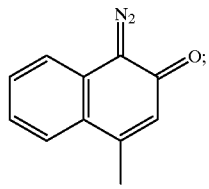

x is 10 to 1000; y is 0 to 900; and b is 0.10 to 350;
a photosensitive agent, and a solvent, thereby forming a coated substrate;
b) prebaking said coated substrate at an elevated temperature;
c) exposing said prebaked coated substrate to actinic radiation;
d) developing said exposed coated substrate with an aqueous developer, thereby forming a developed substrate;
e) curing the developed substrate at an elevated temperature, thereby forming the relief pattern.

14. The process of claim 13, further comprising the step of post exposure baking said exposed coated substrate, after said exposed coated substrate is formed and before said developing step.

15. The process of claim 13, further comprising the step of rinising said developed substrate, after said developed substrate is formed and before said curing step.

16. The process of claim 13, wherein said actinic rays are selected from the group consisting of X-rays, electron beam rays, ultraviolet rays, and visible light rays.

17. The process of claim 13, wherein said actinic rays have a wavelength of 436 nm and 365 nm.

18. The process of claim 13, wherein said aqueous developer is a solution selected from the group consisting of alkalis, primary amines, secondary amines, tertiary amines, alcoholamines, quaternary ammonium salts, and mixtures thereof.

* * * * *

UNITED STATES PATENT AND TRADEMARK OFFICE
CERTIFICATE OF CORRECTION

PATENT NO. : 6,177,225
DATED : January 23, 2001
INVENTOR(S) : William D. Weber, Pamela J. Waterson, Steve Lien-Chung Hsu and Ahmad Naiini It is certified that error appears in the above-identified patent and that said Letters Patent is hereby corrected as shown below:

In the title, insert --NOVEL -- BEFORE "PHOTOSENSITIVE RESIN COMPOSITIONS" to read "NOVEL PHOTOSENSITIVE RESIN COMPOSITIONS"

Column 32, claim 13, line 33, delete "A" and insert --Z--.

Signed and Sealed this

Fifth Day of June, 2001

*Attest:*

*Attesting Officer*

NICHOLAS P. GODICI

*Acting Director of the United States Patent and Trademark Office*